(12) United States Patent
Shimizu

(10) Patent No.: US 6,728,133 B2
(45) Date of Patent: Apr. 27, 2004

(54) NONVOLATILE SEMICONDUCTOR MEMORY DEVICE

(75) Inventor: Shu Shimizu, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/162,619

(22) Filed: Jun. 6, 2002

(65) Prior Publication Data

US 2003/0007384 A1 Jan. 9, 2003

(30) Foreign Application Priority Data

Jul. 9, 2001 (JP) ........................................ 2001-207913

(51) Int. Cl.[7] .............................................. G11C 16/04
(52) U.S. Cl. .......................... 365/185.03; 365/185.33; 365/185.09; 365/200
(58) Field of Search ....................... 365/185.03, 185.33, 365/185.09, 200

(56) References Cited

U.S. PATENT DOCUMENTS

| | | | | | |
|---|---|---|---|---|---|
| 6,067,248 A | * | 5/2000 | Yoo | ....................... | 365/185.03 |
| 6,122,193 A | * | 9/2000 | Shibata et al. | ......... | 365/185.03 |
| 6,353,553 B1 | * | 3/2002 | Tamada et al. | ........ | 365/185.03 |
| 6,496,409 B2 | | 12/2002 | Kobayashi et al. | .... | 365/185.03 |
| 6,558,967 B1 | * | 5/2003 | Wong | ........................... | 438/17 |

FOREIGN PATENT DOCUMENTS

| | | |
|---|---|---|
| JP | 6-309890 | 11/1994 |
| JP | 11-345491 | 12/1999 |
| JP | 2001-6374 | 1/2001 |

* cited by examiner

Primary Examiner—Van Thu Nguyen
Assistant Examiner—Toan Le
(74) Attorney, Agent, or Firm—McDermott, Will & Emery

(57) ABSTRACT

Binary mode memory cells each storing data of a single bit per cell and multilevel mode memory cells each storing data of multi bits per cell are allocated with different address regions in a fixed manner and are formed in different regions. According to the fixed address allocation, the binary mode memory cells and the multilevel mode memory cells can be optimized individually and separately. In this way, the reliability of a nonvolatile semiconductor memory device is improved and the area occupied by the memory arrays is reduced.

12 Claims, 6 Drawing Sheets

INDIVIDUAL PARAMETER
(E.G. IMPURITY PROFILE)
OPTIMIZATION

NONVOLATILE SEMICONDUCTOR MEMORY DEVICE

BACKGROUND OF THE INVENTION

1. Field of the Invention

The present invention relates to semiconductor memory devices and, in particular, to nonvolatile semiconductor memory devices for storing data in a nonvolatile fashion. More specifically, the invention relates to a nonvolatile semiconductor memory device superior in area use efficiency.

2. Description of the Background Art

As one type of semiconductor memory devices, there is a nonvolatile semiconductor memory device that retains data in a nonvolatile fashion. One typical example of the nonvolatile semiconductor memory devices is flash EEPROM (electrically erasable programmable read-only memory, hereinafter referred to as flash memory) capable of electrically programming (writing) and erasing data.

FIG. 12 schematically shows an exemplary structure of a memory cell of a conventional flash memory. Referring to FIG. 12, the memory cell includes impurity regions SR and DR formed, being spaced apart from each other, on a substrate region SUB, a floating gate FG formed above the region between impurity regions SR and DR with an insulating film (not shown) laid thereunder, and a control gate CG placed above and facing floating gate FG.

Impurity regions SR and DR serve as source and drain regions, respectively. This nonvolatile memory cell is constituted of a stacked gate field effect transistor having the control gate and floating gate. The nonvolatile memory cell has a threshold voltage changed according to the amount of charges (electrons) accumulated on floating gate FG, and stores data according to whether or not the threshold voltage is higher than a reference voltage.

The operations of injection of charges into floating gate FG and ejection of charges out of floating gate FG are referred to differently depending on the configuration of peripheral circuitry of the flash memory cell. For one nonvolatile semiconductor memory device, the state in which charges are drawn out of floating gate FG is referred to as a written state (programmed state) while the state in which charges are injected into floating gate FG is referred to as an erased state. For another nonvolatile semiconductor memory device, the state in which charges are drawn out of floating gate FG is referred to as the erased state while the state in which charges are injected into floating gate FG is referred to as the written (programmed) state.

Regardless of the memory cell structure, data is stored according to the amount of charges accumulated on the floating gate.

FIG. 13 schematically shows a distribution of data stored in nonvolatile memory cells. In FIG. 13, the vertical axis represents threshold voltage Vth of the nonvolatile memory cells and the horizontal axis represents the number of memory cells (bits).

It is supposed here that semiconductor substrate region SUB is a p-type substrate region and a nonvolatile memory cell is constituted of an n-channel field effect transistor. Thus, increase in the number of electrons accumulated on floating gate FG increases threshold voltage Vth. According to the amount of charges accumulated on floating gate FG, the region where threshold voltages Vth of the memory cells distribute is divided into region RA and region RB. In region RA, threshold voltage Vth is higher than reference voltage VREF. In region RB, threshold voltage Vth is lower than reference voltage VREF. Depending on whether a nonvolatile memory cell falls in region RA or region RB, the memory cell can store data of a different logic level.

For example, whether the nonvolatile memory cell falls in region RA or RB can be determined according to whether or not a current flows between impurity regions SR and DR of the nonvolatile memory cell when reference voltage VREF is applied to control gate CG. Specifically, if the nonvolatile memory cell falls in region RA, reference voltage VREF applied to control gate CG does not cause a channel to be formed therein and accordingly causes no current to flow between impurity regions SR and DR. On the other hand, if the nonvolatile memory cell falls in region RB, in accordance with reference voltage VREF applied to control gate CG, a channel is formed between impurity regions SR and DR and accordingly a current flows in between.

In other words, the nonvolatile memory cell stores data of different logic levels, i.e., binary data of a single bit, according to whether the threshold voltage of the memory cell is higher or lower than reference voltage VREF.

FIG. 14 shows another distribution of data stored in memory cells. Referring to FIG. 14, the region where threshold voltages Vth of the memory cells distribute is divided into four regions RG0-RG3 based on reference voltages VREF1-VREF3. Different data is stored depending on where threshold voltage Vth of a nonvolatile memory cell falls among regions RG0-RG3. According to the threshold voltage distribution as shown in FIG. 14, the nonvolatile memory cell can assume one of the four states. When regions RG0-RG3 are correlated with data "0", "1", "2" and "3", for example, this nonvolatile memory cell can thus store four-level data. This means that the nonvolatile semiconductor memory device having the threshold voltage distribution as shown in FIG. 14 can store two-bit data per cell.

If a single memory cell stores multilevel data, such as four-level data, this storage of multi-bit data per cell allows reduction in the number of memory cells, as compared with the construction for storage of binary data per cell. Consequently, the area occupied by a memory array can be reduced. However, writing/reading of multilevel data requires comparison between each of three stepped reference voltages VREF1-VREF3 with threshold voltage Vth of this memory cell. Therefore, for storage or reading of data, the voltage to be applied to control gate CG has to be changed in three steps. Consequently, the nonvolatile memory cell storing the multilevel data (hereinafter referred to as multilevel mode memory cell) requires a longer time to write and read data, as compared with the nonvolatile memory cell storing binary data (hereinafter referred to as binary mode memory cell), which results in a longer access time.

Japanese Patent Laying-Open Nos. 2001-6374 and 11-345491 for example disclose a configuration intended for improving data reliability and reducing the area occupied by a memory array, in which multilevel mode memory cells and binary mode memory cells are formed in the common memory array.

According to the above-mentioned prior art, multilevel mode memory cells and binary mode memory cells are formed within the same memory array and these memory cells are fabricated under the same manufacturing conditions. It is accordingly impossible to make transistor characteristics required for binary mode memory cells different from transistor characteristics required for multilevel mode memory cells. A problem is caused that the reliability of both binary mode and multilevel mode memory cells is difficult to ensure.

In general, the multilevel mode memory cells are formed intending to replace a hard disk as an application. The multilevel mode memory cells are required, according to the specification thereof, to allow a greater number of times of rewriting, as compared with the binary mode memory cells. Therefore, for data writing, the number of times programming and erasure pulses are applied to the multilevel mode memory cells as well as the time consumed for this pulse application are increased beyond those of binary mode memory cells. For writing of data, a greater voltage stress is accordingly applied to gate insulating films (or tunnel insulating films) of the multilevel mode nonvolatile memory cells than that in the binary mode memory cells. Therefore, when the multilevel mode memory cells and binary mode memory cells are fabricated under the same manufacturing conditions a problem of degradation in the reliability of stored data is caused as the multilevel mode memory cells are rewritten an increased number of times.

If the characteristics of the binary mode memory cells are adapted to those of the multilevel mode memory cells, an excessively higher reliability is required for the gate insulating film of the binary mode memory cells. Therefore, the thickness of the gate insulating film is increased, which disadvantageously increases an access time of the binary mode memory cells.

In addition, the amount of transported charges in one writing/erasing operation of a binary mode memory cell is different from that of a multilevel mode memory cell. Further, in reading, a voltage applied to a selected word line (control gate) is different between the binary mode memory cell and the multilevel mode memory cell. Therefore, if the common control circuit is used for access control of the multilevel mode memory cell and of the binary mode memory cell, a significant burden would be loaded on the control circuit.

As for the multilevel memory cells, in order to implement the same storage capacity, a required number of memory cells is smaller than that of binary mode memory cells. Thus, the area occupied by the array of multilevel mode memory cells can be made smaller than that of binary mode memory cells. However, for the array configuration including multilevel mode memory cells, if fusible link elements (fuse elements) are used for repairing of a defective address, internal voltage trimming and such, the link elements each occupy a relatively larger area than the area occupied by memory cell transistors. This is done for preventing any adverse effect, such as the short circuit in an element located near the link elements, due to scattering of the fragment of a blown off link element. Therefore, where a program circuit constituted of such fuse elements is used, the program circuit requires a large layout area and thus makes it impossible to reduce the chip area, which would provide a great drawback to the reduced chip area that is one advantage of the multilevel mode memory.

SUMMARY OF THE INVENTION

An object of the present invention is to provide a highly reliable nonvolatile semiconductor memory device occupying a small area and capable of surely storing data.

Another object of the present invention is to provide a nonvolatile semiconductor memory device capable of surely storing binary data and multilevel data depending on an application of use, without deteriorating a system performance.

Still another object of the present invention is to provide a nonvolatile semiconductor memory device occupying a small area and capable of surely storing data for setting an internal state.

A semiconductor memory device according to an aspect of the present invention includes a first memory array having a plurality of first memory cells each storing single-bit data and a second memory array having a plurality of second memory cells each storing multi-bit data. The first and second memory arrays are formed in separate regions. The first memory array and the second memory array have respective address spaces fixedly allocated in advance. The address spaces are made non-overlapping with each other for the first and second memory arrays. The first and second memory arrays are formed on a common semiconductor substrate.

A nonvolatile semiconductor memory device according to another aspect of the present invention includes a first memory array having first memory cells each storing multi-bit information, and a program circuit for storing information for setting a predetermined internal state. The first memory array and the program circuit are formed in separate regions. The program circuit includes a memory cell which is the same in structure as a memory cell storing single-bit data.

A first memory array having binary mode memory cells and a memory array having multilevel mode memory cells are formed in separate regions. Therefore, optimized memory cells can be manufactured in the first and second memory arrays. A highly reliable semiconductor memory device occupying a small area is implemented.

The information for setting a predetermined internal state is stored by the memory cell having the same structure as that of the first memory cell, and the binary data can be stored in a stable and accurate state and accordingly, the internal state can stably be maintained in the programmed state.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
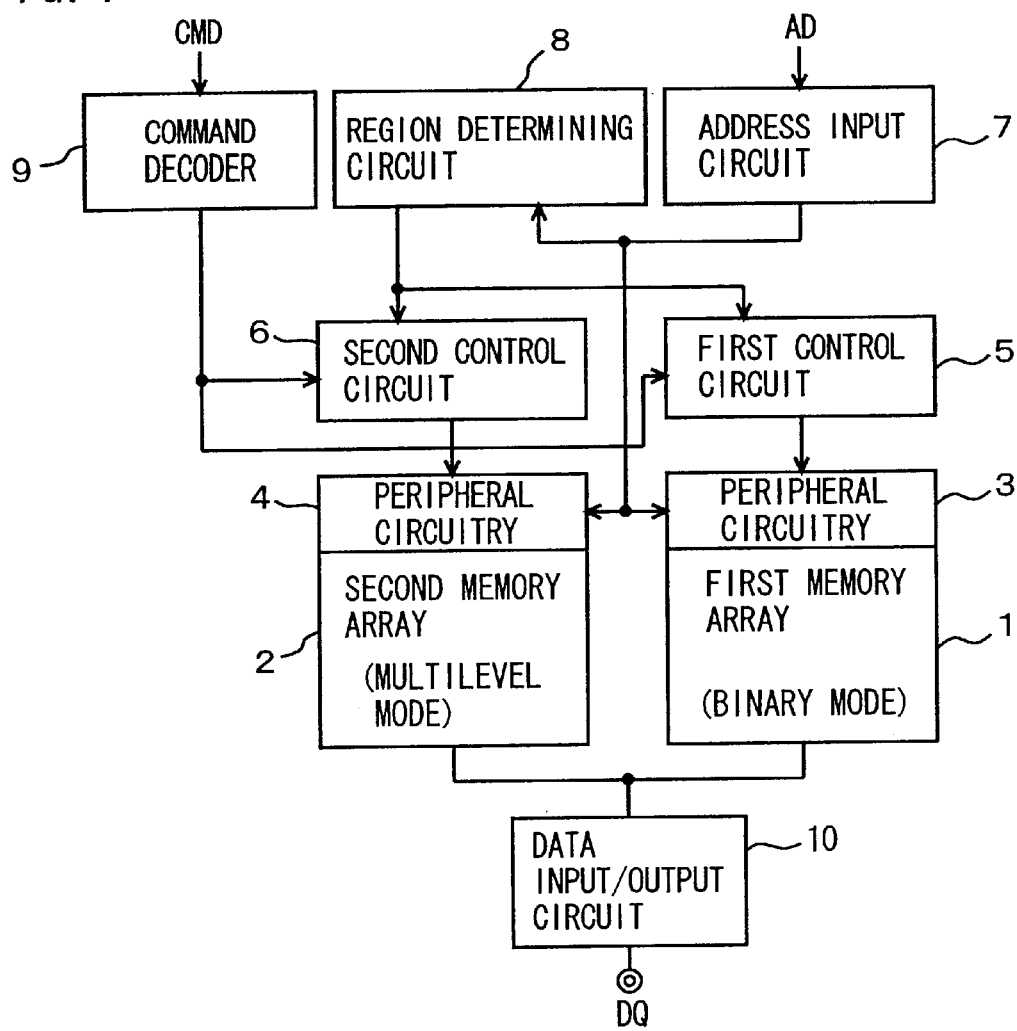
FIG. 1 schematically shows a configuration of a main part of a semiconductor memory device according to a first embodiment of the present invention.

FIG. 1 is a schematic diagram showing an entire construction of a nonvolatile semiconductor memory device according to a first embodiment of the present invention. Referring to FIG. 1, the nonvolatile semiconductor memory device includes a first memory array 1 having binary mode memory cells, a second memory array 2 having multilevel mode memory cells, peripheral circuitry 3 including a circuit for selecting a memory cell of the first memory array 1 and a circuit for applying a voltage necessary in writing (programming)/erasing and others, peripheral circuitry 4 including a circuit for selecting a memory cell of the second memory array 2 and a circuit for applying a voltage necessary in writing/erasing and others, a first control circuit 5 provided for peripheral circuitry 3, a second control circuit 6 provided for peripheral circuitry 4, an address input circuit 7 receiving and transmitting externally applied address signal AD to respective address decoding circuits included in peripheral circuitry 3 and peripheral circuitry 4, a region determining circuit 8 receiving a predetermined address signal bit from address input circuit 7 to determine which of the first memory array 1 and the second memory array 2 is designated, and a command decoder 9 receiving externally supplied command CMD instructing an operation mode and generating and supplying an internal operation mode instruction signal to the first and second control circuits 5 and 6.

The first memory array 1 and the second memory array 2 have respective address spaces allocated fixedly. The address spaces of the first and second memory arrays 1 and 2 do not overlap each other. Thus, separate address spaces are allocated in advance for storing binary data and for storing multilevel data, so that the address space for storing the binary data is never used for storing multilevel data. Therefore, a memory cell of the first memory array 1 for storing binary data and a memory cell of the second memory array 2 for storing multilevel data are optimized individually with respect to operational and electrical characteristics.

Region determining circuit 8 receives a predetermined address signal bit from address input circuit 7, and determines whether the address signal designates the address space allocated to the first memory array 1 or the address space allocated to the second memory array 2 and activates one of the first control circuit 5 and the second control circuit 6 in accordance with the determination result. Region determining circuit 8 simply receives and decodes the address signal bit for identifying the address spaces respectively allocated to the first memory array 1 and to the second memory array 2. Then, according to the result of decoding, region determining circuit 8 activates a signal (array indication or activation signal) for activating an addressed one of the first and second memory arrays 1 and 2. Responsively, the control circuit corresponding to the array designated by this array activation signal is activated for performing a control operation necessary for a designated operation.

The internal operation mode instruction signal from command decoder 9 instructs any of writing, erasing and reading operation modes. Command CMD includes a normally used output enable signal ZOE as a command instructing an operation mode.

The first and second memory arrays 1 and 2 are commonly coupled to a data input/output circuit 10. The first control circuit 5 generates, according to the internal operation mode instruction signal from command decoder 9, control signals required for writing, reading and erasing of data of binary mode memory cells. The second control circuit 6 generates, according to the internal operation mode instruction signal, control signals required for writing, reading and erasing of data of multilevel mode memory cells.

Data in a binary mode memory cell and data in a multilevel mode memory cell are read in different operation sequences. Similarly, the binary mode memory cell and the multilevel mode memory cell are written and erased in different operation sequences. Specifically, for reading, erasing and writing of the multilevel mode memory cell, a voltage applied to a selected word line must be switched between a plurality of reference voltages. The first control circuit 5 and the second control circuit 6 are provided separately and exclusively for accomplishing control of different operation sequences. The first and second control circuits 5 and 6 are merely required to control binary mode memory cells and multilevel mode memory cells, respectively. The circuit load as well as the complexity of the circuit configuration are reduced, as compared with a configuration in which one common control circuit controls writing, reading and erasing of data for both of the binary mode memory cells and multilevel mode memory cells.

In other words, it is unnecessary to change a level of a generated reading voltage, change the width of a write (programming)/erase pulse and change a verify operation depending on the binary mode and multilevel mode. Individual optimization is possible to the respective control circuits for the binary mode operation and for the multilevel mode operation. The circuit load is accordingly reduced and an accurate and stable writing/erasing operation is ensured.

Figure 2:
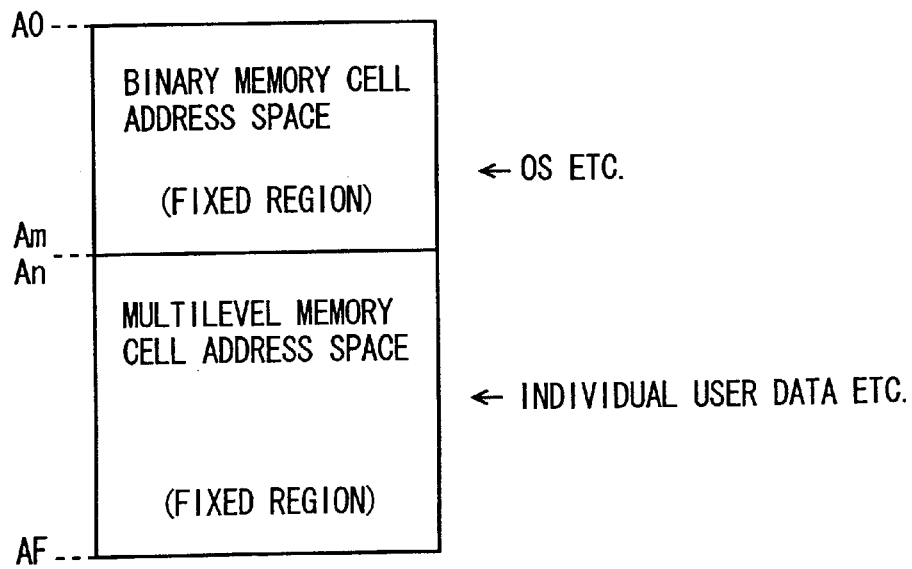
FIG. 2 schematically shows allocation of address spaces to memory cells in the semiconductor memory device according to the first embodiment of the present invention.

FIG. 2 schematically shows address spaces allocated to the first memory array 1 and the second memory array 2. Referring to FIG. 2, addresses A0-Am are allocated to the first memory array 1 while addresses An-AF are allocated to the second memory array 2. The allocation of the address spaces is fixed.

In the address space of binary mode memory cells, data required of high reliability and high-speed reading are stored, such as data of programs and codes of an operating system (OS) necessary for operating an equipment itself in a portable data terminal such as a portable phone or pocket phone. In the address space of multilevel mode memory cells, information written by an individual user, such as a telephone number and a mail address, is stored since a fast access thereto is not particularly required. In order to cure occurrence of an error, an ECC (error checking and correction) circuit is provided for the data in the address space of multilevel mode memory cells.

In particular, an error of one-bit data in musical data and image data has no significant influence on the entire data processing and thus, a high reliability is not required. Such large amount of image/audio data are stored in the multilevel mode memory cell address space to allow the storage of a large amount of data in a reduced occupying area. In this case, the ECC circuit is unnecessary.

In this way, the area occupied by the memory arrays can be reduced without deterioration in the reliability of stored data and processing speed, by storing data in the first memory array 1 having binary mode memory cells and the second memory array 2 having multilevel mode memory cells selectively depending on the requirement on processing speed and reliability of data.

Figure 3:
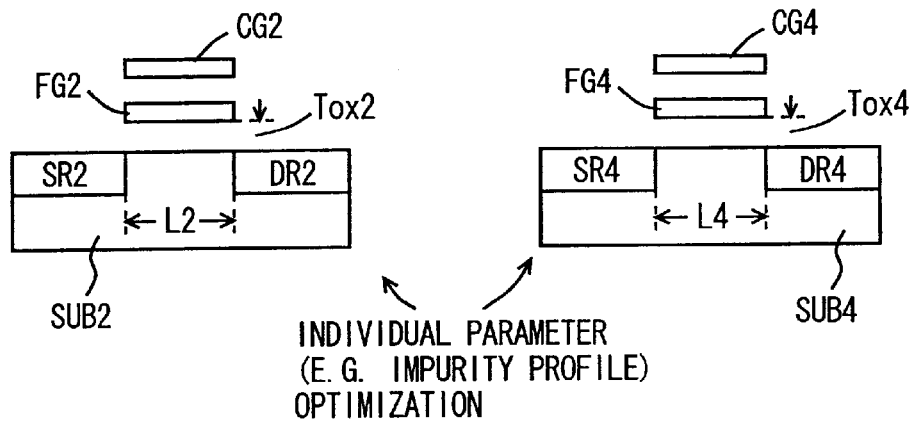
FIG. 3 schematically shows structures of binary mode and multilevel mode memory cells according to the first embodiment of the present invention.

FIG. 3 schematically shows cross sectional structures of a binary mode memory cell and a multilevel mode memory cell. Referring to FIG. 3, the binary mode memory cell includes impurity regions SR2 and DR2 formed being spaced apart from each other on a semiconductor substrate region SUB2, a floating gate FG2 formed above the region between impurity regions SR2 and DR2 with a gate insulating film (tunnel insulating film, not shown) laid thereunder, and a control gate CG2 formed above and facing floating gate FG2 with an interlayer insulating film (not shown) interposed between. The tunnel insulating film of Tox2 in thickness is formed between floating gate FG2 and semiconductor substrate region SUB2.

The multilevel mode memory cell includes impurity regions SR4 and DR4 formed being spaced apart from each other on a semiconductor substrate region SUB4, a floating gate FG4 formed above the region between impurity regions SR4 and DR4 with an insulating film (gate insulating film or tunnel insulating film, not shown) laid thereunder, and a control gate CG4 formed above and facing floating gate FG4 with an interlayer insulating film (not shown) interposed in between. The tunnel insulating film of Tox4 in thickness is formed between floating gate FG4 and semiconductor substrate region SUB4.

Respective substrate regions of the binary mode memory cell and multilevel mode memory cell are formed in different regions and formed by different well regions on the same semiconductor substrate.

As shown in FIG. 3, the nonvolatile memory cells each having the structure of stacked gate field effect transistor are formed in individual separate regions. The binary mode memory cell and multilevel mode memory cell each have structural parameters adjusted so as to optimize transistor characteristics.

For example, in order to meet a high-speed operation requirement, thickness Tox of the tunnel insulating film is reduced to speed up the movement of charges in writing/erasing operation. In order to meet a requirement of a high dielectric breakdown voltage characteristic, thickness Tox of the tunnel insulating film is increased. In other words, the minimum required thickness of Tox of the tunnel insulating film is maintained and thickness Tox is adjusted according to requirements of operating speed and dielectric breakdown voltage characteristic (reliability of the insulating film thickness) and others. Thickness Tox2 of the tunnel insulating film of the binary mode memory cell and thickness Tox4 of the tunnel insulating film of the multilevel mode memory cell are each adjusted as described above according to required characteristics of the binary mode memory cell and multilevel mode memory cell.

The tunnel insulating films are adjusted in thickness, through such a process as dual-gate-process, according which the insulating films common in thickness to binary and multilevel mode memory cells are formed in the same process step, and for the film portions of different thickness, the tunneling insulating film of the required thickness is formed through different process steps by means of a mask or the like.

The binary mode memory cell has channel length L2 while the multilevel mode memory cell has channel length L4. Adjustment of channel length L allows the equivalent resistance of the transistor to change or to be made different and also the amount of a drive current to be adjusted and thus, the amount of a drive current in reading can be adjusted to achieve the high speed access. In addition, through the adjustment of the channel length L, when channel hot electrons (CHE) are used for writing/erasing, for example, the channel drive current can be adjusted to control the amount of charges driven in response to writing (programming)/erasing pulse. The degree of change of the threshold voltage when one write/erase pulse is applied can be optimized.

In particular, for the multilevel mode memory cell, the degree of change of the threshold voltage caused by application of a write/erase pulse is preferably made small as compared with the binary mode memory cell, in order to prevent the threshold voltage from exceeding a intended range when multilevel data is written. The multilevel data can be written by using a pulse of the same width as that of a write/erase pulse for the binary mode memory cell. Accordingly, it is possible to optimize the range in which the threshold voltage changes when a write/erase pulse is applied in writing/erasing of the binary mode memory cells and of the multilevel mode memory cells.

Further, by optimization of an impurity concentration distribution (impurity profile) in the channel region, a drain electric field generated by application of a high voltage in writing (programming)/erasing can be relaxed, with the high voltage being applied between the substrate and control gate or between the control gate and the drain. In this way, the reliability of the tunnel insulating film can be ensured.

Moreover, by adjustment of the impurity profile in the channel region, the efficiency in generation of channel hot electrons can be adjusted. Thus, the injection efficiency can be optimized individually for the binary mode memory cell and for multilevel mode memory cell.

As described above, binary mode memory cells are formed in one region and multilevel mode memory cells are formed in another region and the respective address spaces are fixed. Thus, one memory cell is never used as both of a binary mode memory cell and a multilevel mode memory cell. Individual optimization of the memory cells is accordingly accomplished for the binary mode memory cells and for multilevel mode memory cells. Multilevel mode memory cells and binary mode memory cells are fabricated in the separate memory array regions and the following advantages can be achieved, as compared to the construction in which the binary mode memory cells and the multilevel mode memory cells are formed in the same memory array region. The regularity of the memory cell pattern in each region can be maintained and structural parameters of the binary mode and of multilevel mode memory cells can easily be optimized through separate process steps and thus, the binary mode and multilevel mode memory cells can be optimized individually and independently.

By changing the impurity profile according to the frequency of data rewriting or the like, the voltage stress on the tunnel insulating film due to the drain electric field upon application of a high voltage can be relaxed and thus, the reliability of the insulating film can be ensured. For example, since basic information of a system, such as OS and program codes, is stored in the binary mode memory array, the rewriting frequency thereof is relatively low, as compared with the rewriting frequency of individual user data or the like. Therefore, the tunnel insulating films of the binary mode memory cells are made thinner relative to that of the multilevel mode memory cell so as to ensure the high-speed operation characteristic. On the other hand, the tunnel insulating film of the multilevel mode memory cell is made relatively thicker so as to ensure the reliability of the insulating film.

Figure 4A:
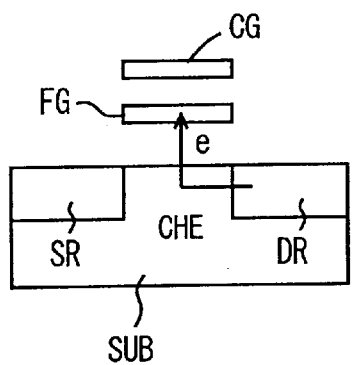
FIGS. 4A and 4B schematically show a manner of injecting electrons into the floating gate of a nonvolatile memory cell.

FIG. 4A schematically shows a manner of injecting electrons represented by "e" into a floating gate FG. A memory cell transistor in FIG. 4A is constituted of a stacked n-channel MOS transistor. An n-type source impurity region SR is set at a ground voltage level and an n-type drain impurity region DR is set at a high voltage. A control gate CG is set at a higher voltage level than the voltage of drain impurity region DR. In this state, a channel current flows from n-type drain impurity region DR toward n-type source impurity region SR, and the channel current is accelerated by the high drain electric field, to generate channel hot electrons (CHE). The channel hot electrons are accelerated toward floating gate FG by the high voltage applied to control gate CG and thus electrons e are injected into floating gate FG. Electrons, e, injected into floating gate FG increase the threshold voltage of the memory cell.

Figure 4B:
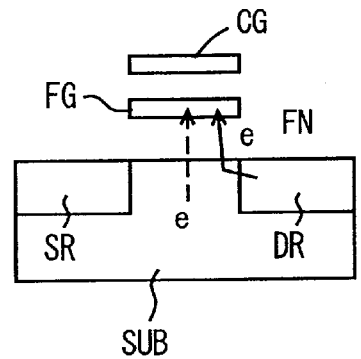

FIG. 4B schematically shows another manner of injecting electrons, e, into floating gate FG. The memory cell in FIG. 4B is also constituted of a stacked n-channel MOS transistor. A high voltage is applied to control gate CG, n-type drain impurity region DR is kept at a ground voltage level for example, and n-type source impurity region SR is set in an electrically floating state. In this state, a Fowler-Nordheim tunneling current flows from drain region DR toward floating gate FG and accordingly electrons, e, are injected into floating gate FG.

In addition, as indicated by the broken line in FIG. 4B, electrons, e, can be injected from substrate region SUB into floating gate FG by maintaining substrate region SUB at the ground voltage level and setting impurity regions SR and DR in the floating state.

There are thus at least three methods of injecting electrons, e, into floating gate FG, i.e., by means of channel hot electrons (CHE), FN current and substrate electrons. Different methods are used for injecting electrons, e, into floating gates FG for a binary mode memory cell and for a multilevel mode memory cell. For example, electrons are injected into floating gate FG by means of channel hot electrons in the binary mode memory cell while electrons are injected into floating gate FG by means of the FN tunneling current or substrate tunneling current in the multilevel mode memory cell. According to a degree of change in the threshold voltage required in one electron-injecting operation, electrons can efficiently be injected into floating gate FG in the binary mode memory cell and in multilevel mode memory cell.

Figure 5A:
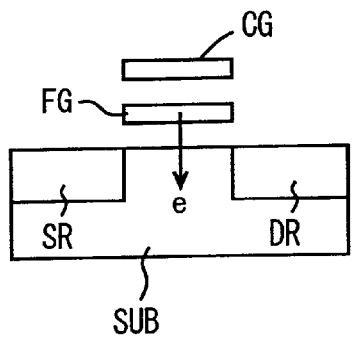
FIGS. 5A and 5B schematically show a manner of drawing electrons out of the floating gate of the nonvolatile memory cell.

FIG. 5A schematically shows a manner of drawing electrons out of floating gate FG. According to the scheme shown in FIG. 5A, electrons, e, are ejected from floating gate FG into semiconductor substrate region SUB. In this case, a ground voltage or negative voltage is applied to control gate CG, a high voltage is applied to semiconductor substrate region SUB, and impurity regions SR and DR are kept in a floating state. FN tunneling current flows between floating gate FG and semiconductor substrate region SUB and electrons, e, are ejected from floating gate FG.

Figure 5B:
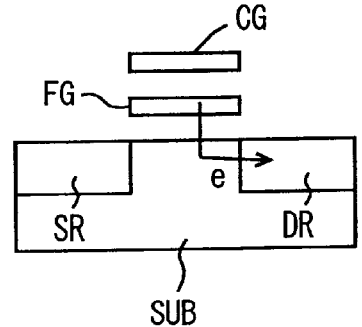

FIG. 5B schematically shows another manner of drawing electrons, e, out of floating gate FG. Referring to FIG. 5B, source impurity region SR is set in a floating state, drain impurity region DR is set at a high voltage level, and a ground voltage or negative voltage is applied to control gate CG. FN tunneling current flows from floating gate FG to drain impurity region DR and electrons, e, are ejected from floating gate FG.

In the methods of ejecting electrons shown in FIGS. 5A and 5B, one of the methods, i.e., ejection to substrate method or ejection to drain method, for example, is used for a binary mode memory cell while the other method is used for a multilevel mode memory cell. Optimization with respect to the degree of change of the threshold voltage in one electron ejecting operation can be achieved for each of the binary mode memory cell and multilevel mode memory cell, according to the relation between the width of a write/erase pulse and the electron ejection efficiency. Fast writing/erasing is thus achieved. Moreover, different methods of injecting/ejecting electrons are used between the binary mode memory cell and multilevel mode memory cell. Therefore, as shown in FIG. 3, transistor parameters of the binary mode memory cell and those of the multilevel mode memory cell can be optimized adaptably to the respective methods of driving electrons. Data can thus be written efficiently.

Further, the first and second control circuits 5 and 6 provided respectively for the binary mode and multilevel mode memory cells control the operation of injecting/ejecting electrons into/from the floating gate. Control circuits 5 and 6 provided separately can be optimized in respective circuit operations (width of a generated pulse, verify operation sequence, for example) individually, according to respective methods of injecting/ejecting electrons.

Figure 6:
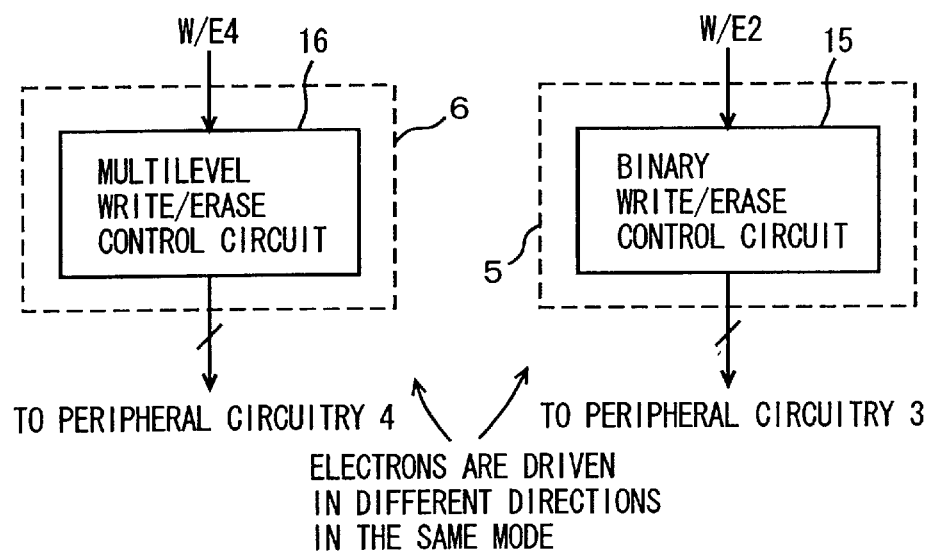
FIG. 6 schematically shows structures of first and second control circuits shown in FIG. 1.

FIG. 6 schematically shows internal structures of the first and second control circuits 5 and 6 shown in FIG. 1. Referring to FIG. 6, the first control circuit 5 includes a binary write/erase control circuit 15 for generating, to peripheral circuitry 3, a voltage/control signal necessary for writing/erasing, according to write/erase instruction signal W/E2.

The second control circuit 6 includes a multilevel write/erase control circuit 16 for generating, to peripheral circuitry 4, a control signal/voltage necessary for writing/erasing, according to write/erase instruction signal W/E4. Binary write/erase control circuit 15 and multilevel write/erase control circuit 16 are activated when respective write/erase instruction signals W/E2 and W/E4 are activated, and generate the control signals/voltages necessary for a designated operation when activated. Binary write/erase control circuit 15 and multilevel write/erase control circuit 16 are each constituted generally by a sequence controller. The control circuits generate a write/erase pulse for writing/erasing and further perform a verify operation to determine if writing (programming)/erasing is accurately performed on a target memory cell.

Write/erase control circuits 15 and 16 employ different methods for injecting and ejecting electrons into and from the floating gate from each other.

In addition, by binary write/erase control circuit 15 and multilevel write/erase control circuit 16, electrons are driven in different directions in the same operation mode. For example, in the erase mode, binary write/erase control circuit 15 generates a control signal/voltage to inject electrons into the floating gate while multilevel write/erase control circuit 16 generates a control signal/voltage to draw electrons out of the floating gate. Specifically, when performing the same operation, i.e., writing (programming) operation or erasing operation, in the binary mode memory cell and multilevel mode memory cell, electrons are driven in different directions with respect to the floating gates.

Writing/erasing can thus be carried out in an optimum operation manner according to characteristics of the memory cells.

Electrons can be driven in different directions in the same operation mode by the first and second control circuits 5 and 6 that are provided separately. These control circuits 5 and 6 can be dedicated to writing/erasing operations of the first and second memory array, respectively. Thus, the writing/erasing operation can easily be performed differently between the binary mode memory cell and multilevel mode memory cell.

Modification

Figure 7:
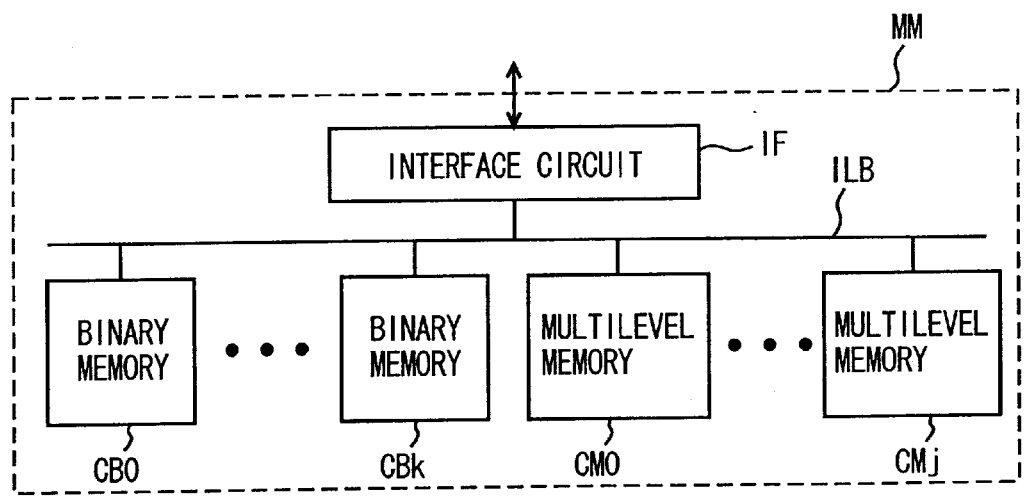
FIG. 7 schematically shows a configuration of a modification of the first embodiment according to the present invention.

FIG. 7 schematically shows a configuration of a modification of the first embodiment according to the present invention. Referring to FIG. 7, a nonvolatile semiconductor memory device is constituted of a memory module MM including a plurality of memory chips. Memory module MM includes binary memories CB0-CBk and multilevel memories CM0-CMj. Memories CB0-CBk and CM0-CMj are coupled to an interface circuit IF through an internal data bus ILB.

In this memory module MM, binary memories CB0-CBk formed of binary mode memory cells and multilevel memories CM0-CMj formed of multilevel mode memory cells are coupled to each other through internal data bus ILB. Separate address spaces are fixedly determined for binary memories CB0-CBk and multilevel memories CM0-CMj. Binary memories CB0-CBk and multilevel memories CM0-CMj are each formed of a chip and each include circuitry for controlling its operation. Binary memories CB0-CBk and multilevel memories CM0-CMj are optimized in terms of circuit parameters such as memory cell structure and operation speed.

As shown in FIG. 7, the nonvolatile semiconductor memory device is formed of memory module MM, in which individual user data are stored in multilevel memories CM0-CMj while OS and data required of high speed processing are stored in binary memories CB0-CBk. Multilevel memories CM0-CMj have a greater storage capacity than that of binary memories CB0-CBk since multilevel memory cells each can store multi-bit data. Therefore, the mass storage nonvolatile semiconductor memory device formed of memory module MM can be implemented without increase in the package area and accordingly large amount of data such as audio and/or image data can be stored in a small area.

As described above, according to the first embodiment of the present invention, address spaces are allocated fixedly in an non-overlapping manner to the region including binary mode memory cells and to the region including multilevel mode memory cells. Memory cells are each alternatively operated as a binary mode memory cell or multilevel mode memory cell. The memory cells each can be optimized in terms of electrical characteristics, and the highly reliable nonvolatile semiconductor memory device occupying a small area is achieved.

In the description above, the region where binary mode memory cells are formed is different from the region where multilevel mode memory cells are formed. However, it is merely necessary that respective address spaces of the binary mode memory cells and multilevel mode memory cells are fixed in advance and the first and second memory arrays may not be arranged particularly in separate regions.

Second Embodiment

Figure 8:
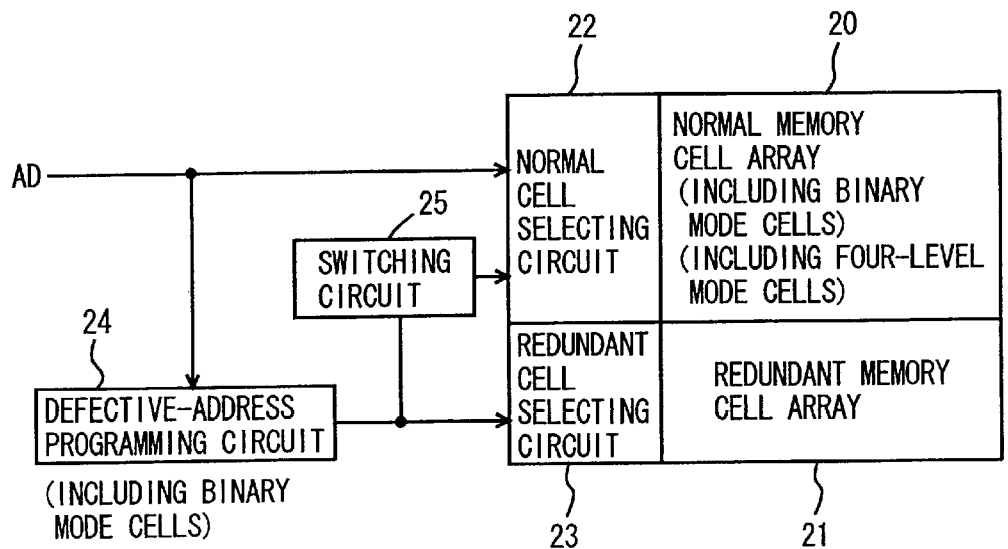
FIG. 8 schematically shows a configuration of a main part of a semiconductor memory device according to a second embodiment of the present invention.

FIG. 8 is a schematic diagram showing a main part of a nonvolatile semiconductor memory device according to a second embodiment of the present invention. Referring to FIG. 8, the nonvolatile semiconductor memory device includes a normal memory cell array 20 having normal memory cells arranged in rows and columns, a redundant memory cell array 21 having redundant memory cells for repairing a defective memory cell in normal memory cell array 20, a defective-address programming circuit 24 for storing an address of a defective normal memory cell in normal memory cell array 20 and determining whether the stored defective address is addressed by externally applied address signal AD, a redundant cell selecting circuit 23 for selecting, when the defective address is determined to be designated by defective-address programming circuit 24, a corresponding redundant memory cell row or column in redundant memory cell array 21, and a switching circuit 25 according to a determination result indicating signal from defective-address programming circuit 24 for selectively inactivating a normal cell selecting circuit 22.

Normal cell selecting circuit 22 selects, when a normal memory cell in normal memory cell array 20 is addressed by external address signal AD, the corresponding normal memory cell.

Normal memory cell array 20 includes binary mode memory cells. Multilevel mode memory cells may be arranged in normal memory cell array 20. Therefore, normal memory cell array 20 may be structured such that binary mode memory cells and multilevel mode memory cells are formed in separate regions, as in the first embodiment. In this case, redundant memory cell array 21 is divided accordingly into a redundant memory cell array for the binary mode memory cells and a redundant memory cell array for the multilevel mode memory cells.

Binary mode memory cells are highly reliable in data holding characteristics and thus reliably stores program data. Data stored in multilevel mode memory cells fall in a relatively narrow range of the threshold voltage, and storage data may be changed from data "11" to data "10" for example due to leakage current. Therefore, defective-address programming circuit 24 uses the binary mode memory cells for programming a defective address. Storage of programmed data by means of the binary mode memory cells makes it possible to store programmed data semi-permanently in a stable state.

Figure 9:
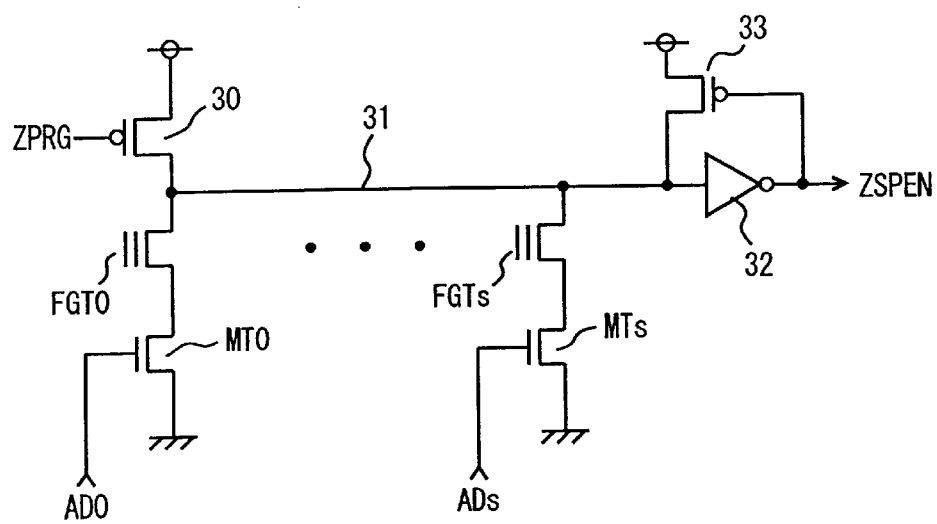
FIG. 9 shows an exemplary configuration of a defective-address programming circuit shown in FIG. 8.

FIG. 9 shows an exemplary configuration of defective-address programming circuit 24 shown in FIG. 8. Referring to FIG. 9, defective-address programming circuit 24 includes a p-channel MOS transistor (insulated gate field effect transistor) 30 connected between a power supply node and an internal signal line 31 and receiving precharge instruction signal ZPRG at its gate, n-channel MOS transistors MT0-MTs provided corresponding to respective address signal bits AD0-ADs and receiving corresponding address signal bits AD0-ADs at their respective gates, stacked gate field effect transistors FGT0-FGTs connected in series between respective MOS transistors MT0-MTs and internal signal line 31, an inverter 32 inverting a signal on internal signal line 31 to generate spare enable signal ZSPEN, and a p-channel MOS transistor 33 turned on, when spare enable signal ZSPEN from inverter 32 attains a logical low level (hereinafter, referred to as L level), to charge internal signal line 31 to a power supply voltage level.

Stacked gate field effect transistors FGT0-FGTs are the same in characteristics/structure as the stacked gate field effect transistors constituting binary mode memory cells in the normal memory cell array, and thus binary data can be accurately programmed and stored. Stacked gate field effect transistors FGT0-FGTs are driven into a conductive/nonconductive state according to a defective address.

Stacked gate field effect transistors FGT0-FGTs have the inverted value of respective defective address bits programmed therein. If the defective address is designated by address signal bits AD0-ADs, one of a stacked gate field effect transistor FGT and an associated MOS transistor MT for each of address signal bits AD0-ADs turns nonconductive state and accordingly internal signal line 31 is maintained at a precharge voltage level. Spare enable signal ZSPEN from inverter 32 attains L level and indicates that the defective address is designated.

If an address other than the defective address is designated, both of stacked gate field effect transistor FGT and corresponding MOS transistor MT for each of address signal bits AD0-ADs are driven into the conductive state so that internal signal line 31 is discharged to a ground voltage level. Accordingly, spare enable signal ZSPEN attains a logical high level (hereinafter, referred to as H level) and indicates that a non-defective address, i.e., a normal address is designated.

Instead of generally used fusible link elements (fuse elements) that occupy a large area, the stacked gate field effect transistors FGT0-FGTs are used, and consequently, the area occupied by the programming elements can be reduced to accordingly reduce the area occupied by defective address programming circuit 24. Further, the stacked gate field effect transistors that are the same in characteristics/structure as the binary mode memory cells are employed as defective-address programming transistors FGT0-FGTs to ensure programming of a defective address. These programming transistors FGT0-FGTs and binary mode memory cells are fabricated through the same manufacturing process and therefore the programming transistors can be fabricated without increasing the number of manufacturing process steps.

If normal memory array 20 is constituted of multilevel mode memory cells, the address of a defective memory cell in the multilevel mode memory array is stored, the relation between the binary mode memory cell and multilevel mode memory cell as described in connection with the first embodiment is satisfied. Specifically, transistor parameters of a programming binary mode memory cell and those of a multilevel mode memory cell are different from each other. Control of the operation of injecting electrons into the floating gate and the operation of drawing electrons out of the floating gate is optimized according to the characteristics of these memory cells. Similarly to the first embodiment, the manner of the operation control is at least partially different for the binary mode memory cells and for the multilevel mode memory cells. If a defective-address programming circuit is provided for the multilevel mode memory cells, the multilevel mode memory cells and memory cells in the programming circuit are fabricated in separate process steps so as to optimize the operational characteristics, as is done in the first embodiment.

Figure 10:
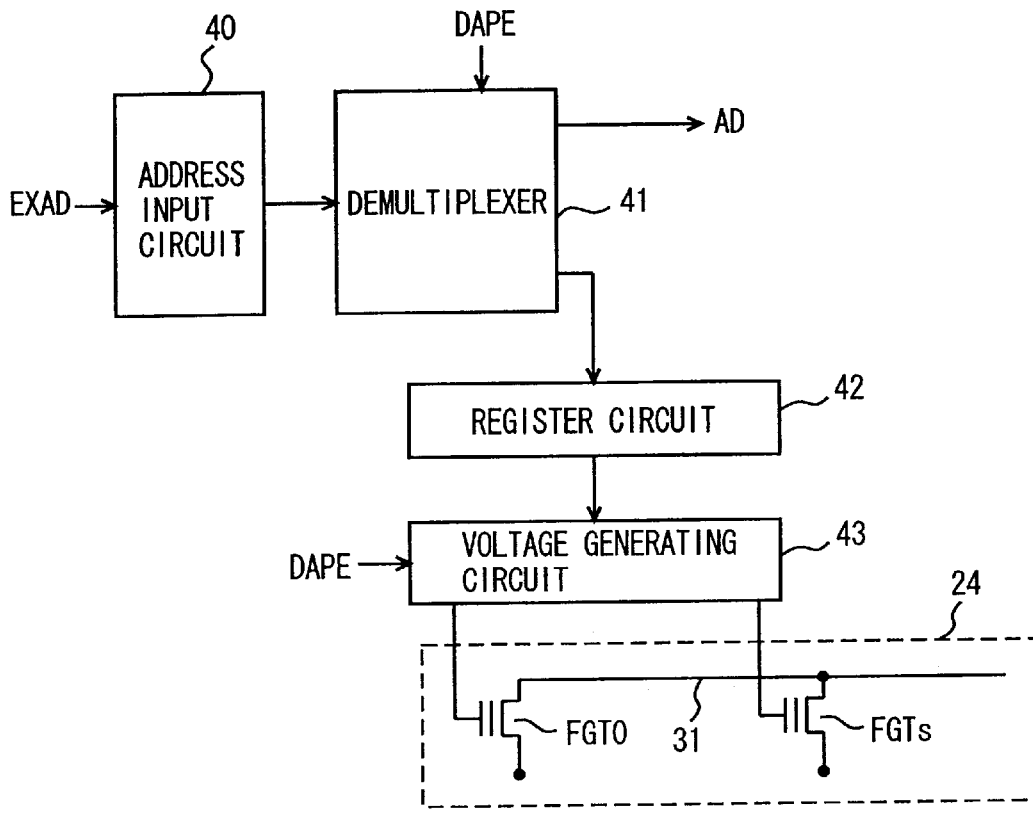
FIG. 10 shows an exemplary structure of a programming unit for stacked gate field effect transistors shown in FIG. 9.

FIG. 10 schematically shows an exemplary configuration of a program control unit for defective-address programming circuit 24. Referring to FIG. 10, the program control unit includes a demultiplexer 41 which is provided for an address input circuit 40 receiving external address signal EXAD and, according to a defective address program mode instruction signal DAPE, supplies the address signal from address input circuit 40 to one of normal cell selecting circuit 22 and a register circuit 42, and a voltage generating circuit 43 which is activated, according to defective address program instruction signal DAPEE, to generate a programming voltage according to address signal bits stored in register circuit 42. The voltages from voltage generating circuit 43 are applied to respective control gates of programming transistors FGT0-FGTs shown in FIG. 9 and accordingly data to be stored in these programming transistors FGT0-FGTs are programmed.

Register circuit 42 includes registers corresponding to the respective address signal bits and voltage generating circuit 43 includes voltage generators corresponding to the respective registers of register circuit 42. The voltages from voltage generating circuit 43 are applied to the respective control gates of stacked gate field effect transistors FGT0-FGTs of defective-address programming circuit 24. When defective address program instruction signal DAPEE is activated, voltage generating circuit 43 generates the programming voltage according to data stored in register circuit 42 and supplies the voltages to the respective control gates of stacked gate field effect transistors FGT0-FGTs. The voltage generators of voltage generating circuit 43 each may be structured similarly to a circuit that stores data to be written in a data writing operation in the normal memory cell array and generates a writing voltage according to the stored write data data.

In the defective address programming mode, an address signal indicating a defective address is supplied through address input circuit 40 as external address signal EXAD, and then through demultiplexer 41 to register circuit 42, in which each bit of the defective address signal specifying the defective address is stored.

Then, according to defective address program mode instruction signal DAPE, voltage generating circuit 43 selectively generates a high voltage according to the defective address bits. If the defective address bit is "1" and a MOS transistor MTi is rendered conductive, a corresponding programming transistor FGTi is rendered nonconductive. If the defective address bit is "0" and MOS transistor MTi is rendered nonconductive, the corresponding programming transistor FGTi is rendered conductive. Thus, programming transistor FGTi corresponding to the defective address bit of "1" has electrons injected into its floating gate, while programming transistor FGTi corresponding to the defective address bit of "0" stays in an initial state and has no electron injected into its floating gate. Immediately after the manufacturing process is completed, the floating gate of the programming transistor is in a state of accumulating no electrons.

Stacked gate field effect transistors FGT0-FGTs have a low threshold voltage level when the manufacturing process is completed. In this defective address programming mode, MOS transistors MT0-MTs are selectively rendered conductive. Therefore, a stacked gate field effect transistor receiving a high voltage at its control gate has electrons injected into its floating gate, and consequently the threshold voltage of this field effect transistor subject to electron injection increases. Therefore, the high voltage is supplied to the control gate of a stacked gate field effect transistor to be rendered nonconductive while no high voltage is supplied to the control gate of a stacked gate field effect transistor to be kept conductive (a ground voltage level or a voltage lower than the programming voltage is supplied). Accordingly, stacked gate field effect transistors FGT0-FGTs can be programmed into the state of storing a defective address.

When the defective address is programmed, electrons may be once ejected from into the floating gate, followed by injection of electrons into the floating gate. In this case, even if the threshold voltage of the programming transistor attains a negative voltage level and the programming transistor is kept in a normally conductive state, no problem occurs. It is only required that a programming transistor to be made nonconductive is set into the nonconductive state.

The defective address programming operation may appropriately be determined so as to optimize the storage characteristics and electrical (writing/erasing) characteristics of the programming cells, in accordance with the structure of the binary mode memory cells constituting the programming circuit, as is done in the first embodiment.

An external testing apparatus is used to supply a defective address, monitor whether or not spare enable signal ZSPEN is activated (spare enable signal ZSPEN is coupled to a specified pad by the switching circuit in this defective address programming mode), and verify if the defective address is accurately programmed. If the defective address has not been programmed, the external testing apparatus again supplies program instruction signal DAPEE for causing the voltage generating circuit 43 to generate a programming voltage. Voltage generating circuit 43 may be configured to monitor spare enable signal ZSPEN to perform the verify operation.

It is noted that the substrate region of stacked gate field effect transistors FGT0-FGTs may be set at a ground voltage or negative voltage in injecting electrons from this substrate region into the floating gate. Alternatively, by means of channel hot electrons, electrons may be injected into the floating gate. One of these electron-injection methods is selected depending on the method of applying a voltage for increasing the threshold voltage of the binary mode memory cells formed in the normal memory cell array.

In this case, if multilevel mode memory cells are provided in normal memory cell array 20, the manner of controlling writing/erasing of the multilevel mode memory cells and the manner of controlling programming of the programming circuit are appropriately selected in accordance with memory cell characteristics, as is done in the first embodiment. In this way, more efficient storage of multilevel data as well as binary programming data is achieved. Without increase in the chip occupation area, it is possible to surely store binary data for setting an internal state (defective address), accurately repair a defect by means of redundancy replacement, and thus implement a highly reliable nonvolatile semiconductor memory device.

If a plurality of defective-address programming circuits 24 are provided corresponding to a plurality of defective addresses, these defective address-programming circuits 24 are coupled sequentially with voltage generating circuit 43 to program defective addresses.

This voltage generating circuit 43 generates, in a normal operation mode, a voltage substantially equal to a reading voltage level and applies the generated voltage to the control gates of stacked gate field effect transistors FGT0-FGTs. Thus, in the normal operation mode, stacked gate field effect transistors FGT0-FGTs are set in either of the conductive and nonconductive states according to program data.

In this case, with the threshold voltage of a programming transistor FGTi in the conductive state set at a negative voltage level, voltage generating circuit 43 may generate the ground voltage to the control gates of programming transistors FGT0-FGTs in the normal operation mode.

In the configuration shown in FIG. 10, the defective address is stored in register circuit 42 via address input circuit 40. However, the configuration may be employed in which a defective address is externally applied to be stored in register circuit 42 via a specific pad. The step of repairing a defective memory cell is performed in a test step which is the final process step in the entire wafer process steps. Therefore, a defective address can be programmed by using the pad.

Modification

Figure 11:
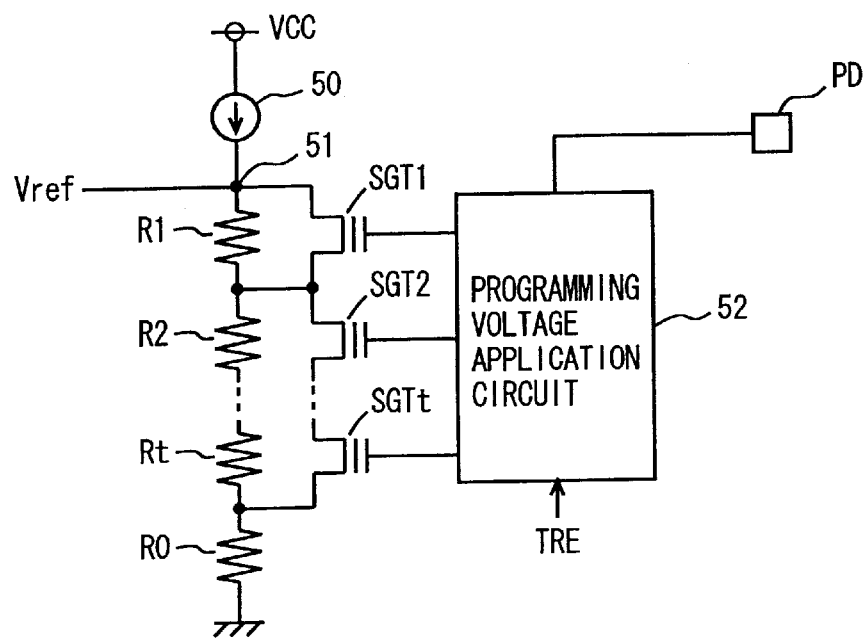
FIG. 11 schematically shows a configuration of a modification of the second embodiment according to the present invention.
Figure 12:
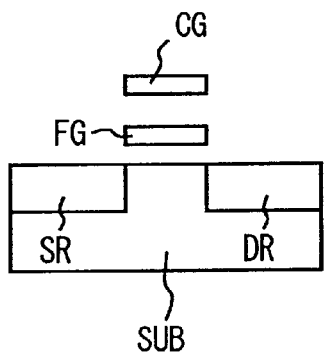
FIG. 12 schematically shows a cross sectional structure of a conventional nonvolatile memory cell.
Figure 13:
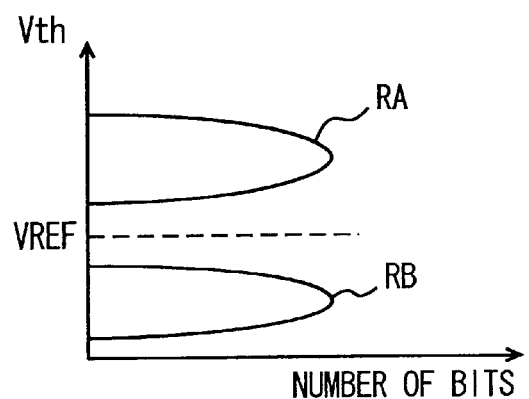
FIG. 13 schematically shows a threshold-voltage distribution of conventional nonvolatile memory cells.
Figure 14:
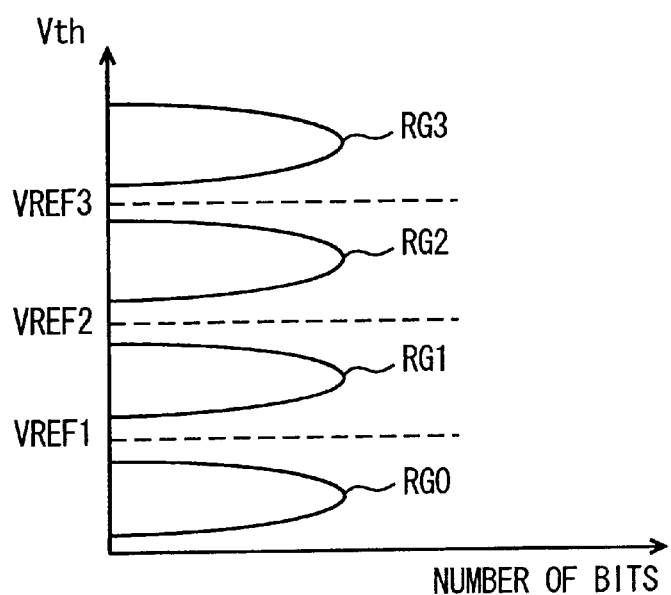
FIG. 14 schematically shows a threshold-voltage distribution of conventional nonvolatile multilevel mode memory cells.

FIG. 11 schematically shows a configuration of a modification of the second embodiment according to the present invention. FIG. 11 shows the configuration for trimming (fine adjustment) of the level of reference voltage Vref generated by a reference voltage generating circuit. Referring to FIG. 11, the reference voltage generating circuit includes a constant current source 50 connected between a power supply node and a node 51 and supplying a constant current, resistor elements R1-Rt connected in series between node 51 and a ground node, stacked gate field effect transistors SGT1-SGTt connected in parallel with resistor elements R1-Rt, and a programming voltage application circuit 52 applying, according to program data provided via a pad PD, a programming voltage specifying the conductive/nonconductive state of each of stacked gate field effect transistors SGT1-SGTt, to respective control gates of stacked gate field effect transistors SGT1-SGTt.

Stacked gate field effect transistors SGT1-SGTt are the same in characteristics/structure as binary mode memory cells and thus reliably store binary data. Programming voltage application circuit 52 includes a shift register to successively take in the program data provided via pad PD, when trimming mode instruction signal TRE is activated, and then apply a high voltage according to the taken in program data. Respective substrate regions of stacked gate field effect transistors SGT1-SGTt are connected together and electrons are injected from the substrate region into a corresponding floating gate. In this way, the low threshold voltage of stacked gate field effect transistors SGT1-SGTt on completion of the manufacturing process is selectively changed to a high threshold voltage.

In a normal operation mode, programming voltage application circuit 52 supplies, to stacked gate field effect transistors SGT1-SGTt, a voltage at a level of reading voltage (VREF) for memory cells. Responsively, stacked gate field effect transistors SGT1-SGTt are selectively rendered conductive/nonconductive depending on the threshold voltage thereof, so that a resistor element Rj connected in parallel with a stacked gate field effect transistor SGTj in a conductive state is short-circuited. Accordingly, the resistance value between node 51 and the ground node is changed to change the voltage level of the reference voltage VREF. In this way, resistor elements R1-Rt are selectively short-circuited by programming of corresponding stacked gate field effect transistors SGT1-SGTt, and the level of reference voltage Vref can be adjusted.

If all of the stacked gate field effect transistors SGT1-SGTt are rendered conductive, reference voltage Vref has a voltage level determined by the resistance value of resistor element R0 and the constant current supplied from constant current source 50, with the channel resistance components of stacked gate transistors SGT1-SGTt not taken into account.

Voltage generating circuit 43 and programming voltage application circuit 52 shown in FIGS. 10 and 11 may be structured similarly to a circuit used, in a general nonvolatile semiconductor memory device, for generating a high voltage according to write data.

With the circuit configuration for trimming the reference voltage, the programming data for determining the reference voltage level can be determined through the following steps. The test program data is first stored in programming voltage application circuit 52, a reference voltage is generated, and checking is made as to if the reference voltage is at a predetermined value or not, and then programming data is modified in accordance with the result of checking.

Alternatively, the programming data may be determined by operating internal circuitry while changing the level of reference voltage Vref and, and by determining the optimum level of reference voltage Vref in accordance with the result of operation of the internal circuitry. Any of these methods may be used to determine programming data for trimming transistors SGT1-SGTt.

According to the configuration shown in FIG. 11, programming voltage application circuit 52 serially stores program data received from the specific pad PD. Alternatively, when trimming mode instruction signal TRE is activated, address signals or signals from specific pads coupled to data signal input terminals may be provided in parallel to programming voltage application circuit 52.

In addition, according to FIG. 11, the resistance value of the resistor circuit is trimmed by programming of the conductive/nonconductive states of the stacked gate transistors. However, the circuit subjected to trimming may be a capacitor circuit including a plurality of capacitance elements. Stacked gate field effect transistors are respectively connected in series to corresponding capacitance elements of the capacitor circuit, and these stacked gate field effect transistors are connected in parallel to a common internal node. The stacked gate field effect transistors are selectively rendered conductive/nonconductive to adjust the number of capacitance elements connected to the internal node and the capacitance value of the capacitor circuit is trimmed. Such capacitance circuit would be employed for stabilizing an internal voltage, for example.

Instead of fuse elements used generally in a conventional fuse programming circuit for programming specific information, stacked gate field effect transistors the same in structure as the binary mode memory cells may be used.

Moreover, in a nonvolatile semiconductor memory device including multilevel mode memory cells, binary mode memory cells may be used as programming elements for setting an internal state such as trimming. In this configuration, electrical characteristics of the programming memory cell transistors are optimized and the manner of controlling writing/erasing is determined based on performance of the programming binary memory cells, independently from that of the multilevel mode memory cells. Efficient and accurate programming can be accomplished.

In the second embodiment, one memory cell array may include multilevel mode memory cells and binary mode memory cells mixedly, and alternatively the multilevel mode memory cells and binary mode memory cells may be formed in separate regions as in the first embodiment. Address spaces for the binary mode memory cells and for the multilevel mode memory cells may fixedly be allocated. In addition, the binary mode memory cells may selectively be used as multilevel mode memory cells and the address spaces for these memory cells may be appropriately changed. Specifically, a predetermined address region in the address space of the binary mode memory cells may selectively be used as a multilevel mode memory cell address space.

The programming circuit for setting an internal state may be arranged in a nonvolatile semiconductor memory device including multilevel mode memory cells only, in which the programming circuit utilizes the binary mode memory cells having electrical characteristics as well as control manner of writing/erasing/reading optimized. According to such arrangement, information for setting an internal state such as a defective address and an internal voltage can be accurately, stably and fixedly stored with reduced area penalty to a small chip area of a multilevel memory.

In this case, the relation in configuration and operation control between binary mode memory cells in the programming circuit and the multilevel mode memory cells may is merely required to follow the relation between the binary mode memory cells and the multilevel mode memory cells in the first embodiment.

As discussed above, according to the second embodiment of the present invention, stacked gate field effect transistors that are the same in structure/characteristics as binary mode memory cells are used for programming a specific internal state. Thus, the occupying area by the programming circuit can be decreased, as compared with the circuit utilizing fuse elements. In addition, the use of the stacked gate field effect transistors that are the same in structure/characteristics as binary mode memory cells allows reliable holding of programmed data.

Moreover, multilevel mode memory cells and binary mode memory cells for setting an internal state are used mixedly, transistor parameters of the multilevel mode memory cells and binary mode memory cells are individually optimized and control manners thereof are also individually optimized. Accordingly, it is possible to reduce the area penalty and ensure storage of information for fixedly setting internal state.

In the description above, the memory cells are each constituted of a stacked gate transistor. However, the present invention is applicable to any memory device, provided that binary data and multilevel data can be stored.

As described heretofore, according to the present invention, the binary mode memory cells and multilevel mode memory cells have their address regions allocated fixedly in a non-overlapping manner. Thus, the structure/characteristics of the binary mode memory cells and multilevel mode memory cells can be optimized individually and accordingly a highly reliable nonvolatile semiconductor memory device with reduced occupying area is achieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a first memory array having a plurality of first memory cells each storing data of a single bit and having a first address space allocated in a fixed fashion in advance;
   a second memory array, arranged in a different region from a region of said first memory array and formed on common semiconductor substrate with said first memory array, having a plurality of second memory cells each storing data of multi bits and having a second address space allocated in a fixed fashion in advance, said first address space being non-overlapping with said second address space, the first memory cells and the second memory cells being each constituted of a stacked field effect transistor having a floating gate;
   a first control circuit provided corresponding to said first memory array for controlling writing, reading and erasing of data for the first memory cells of said first memory array; and
   a second control circuit provided separate from said first control circuit and corresponding to said second memory array for controlling writing, reading and erasing of data for the second memory cells of said second memory array, wherein
   at least one of control operations of programming and erasing for the first memory cells by said first control circuit is different from said at least one of control operations of programming and erasing for the second memory cells by said second control circuit.

2. The semiconductor memory device according to claim 1, wherein the first memory cells are different in structure from the second memory cells.

3. A semiconductor memory device comprising:

a first memory array having a plurality of first memory cells each storing data of a single bit and having a first address space allocated in a fixed fashion in advance;

a second memory array, arranged in a different region from a region of said first memory array and formed on common semiconductor substrate with said first memory array, having a plurality of second memory cells each storing data of multi bits and having a second address space allocated in a fixed fashion in advance, said first address space being non-overlapping with said second address space; and a programming element, the same in structure as the first memory cells and formed in a region different from the region of said first memory array, for fixedly storing predetermined information.

4. The semiconductor memory device according to claim 3, wherein said programming element stores information for fixedly setting a state of an internal circuit.

5. The semiconductor memory device according to claim 3, wherein said programming element stores data indicating whether a defective cell is replaced with a redundant cell as well as a defective address indicating the defective cell.

6. A semiconductor memory device comprising:

a first memory array having a first memory cell each storing information of multi bits; and a programming circuit, formed on a common semiconductor substrate with said first memory array and arranged in a different region from a region of said first memory array, for storing information setting a predetermined internal state, said programming circuit including a memory cell the same in structure as a memory cell storing data of a single bit per cell.

7. The semiconductor memory device according to claim 6, further comprising a second memory array, arranged in a different region from the region of said first memory array, having a plurality of second memory cells each storing data of a single bit, each second memory cell being the same in structure as the memory cell of said programming circuit, an address space of the first memory array and an address space of said second memory array being so allocated fixedly in advance as to share no common address space.

8. The semiconductor memory device according to claim 6, wherein the first memory cell and the memory cell of said programming circuit are each constituted of a stacked field effect transistor having a floating gate.

9. The semiconductor memory device according to claim 8, wherein the first memory cell is different in structure from the memory cell of said programming circuit.

10. The semiconductor memory device according to claim 6, further comprising:

a first control circuit provided corresponding to said first memory array for controlling writing, reading and erasing of data for the first memory cells of said first memory array; and a second control circuit provided corresponding to said programming circuit for controlling writing, reading and erasing of data for the memory cell of said programming circuit, wherein at least one of control operations of programming and erasing for the first memory cells by said first control circuit is different from said at least one of control operations of programming and erasing for the memory cell of said programming circuit by said second control circuit.

11. The semiconductor memory device according to claim 6, wherein the memory cell of said programming circuit stores information for fixedly setting a state of an internal circuit.

12. The semiconductor memory device according to claim 6, wherein the memory cell of said programming circuit stores data indicating whether a defective cell is replaced with a redundant cell as well as a defective address indicating the defective cell.

* * * * *